United States Patent [19]

Liedtke

[11] 4,360,889
[45] Nov. 23, 1982

[54] ROTARY POSITION INDICATING CIRCUIT

[75] Inventor: Rudolph J. Liedtke, Detroit, Mich.

[73] Assignee: F. Jos. Lamb Company, Warren, Mich.

[21] Appl. No.: 165,272

[22] Filed: Jul. 2, 1980

[51] Int. Cl.³ .................... G06G 7/22; G01B 7/30; H03D 13/00
[52] U.S. Cl. .................... 364/559; 328/133; 340/347 SY; 340/870.18; 364/815
[58] Field of Search ............ 364/815, 816, 817, 730, 364/559; 328/133; 340/347 SY, 870.18

[56] References Cited

U.S. PATENT DOCUMENTS

| | | | |
|---|---|---|---|
| 3,548,321 | 12/1970 | Duquesne | 328/133 |
| 3,555,541 | 1/1971 | Egerton et al. | 364/815 X |
| 3,646,455 | 2/1972 | Coccagna | 328/133 |
| 3,786,333 | 1/1974 | Sommeria | 318/604 |
| 3,803,567 | 4/1974 | Pezzlo et al. | 340/870.18 |
| 3,825,738 | 7/1974 | Blaschke et al. | 364/815 X |
| 3,872,388 | 3/1975 | James | 328/133 |
| 4,246,497 | 1/1981 | Lawson et al. | 328/133 X |

Primary Examiner—Felix D. Gruber

Attorney, Agent, or Firm—Barnes, Kisselle, Raisch & Choate

[57] ABSTRACT

A circuit for indicating angular position of a rotary member comprising a resolver including an amplitude stabilized sine-cosine generator coupled to quadrature windings of the resolver for providing a d.c. signal which varies as a linear function of the position of a rotatable member coupled to the resolver. The d.c. signal is fed to a plurality of comparators for comparing such angular position to a plurality of predetermined angular set points. The comparators are coupled to a priority encoder for indicating angular position of the rotary member. The encoder includes a switch array and a plurality of exclusive-OR gates for programming the encoder to provide a zero output at an arbitrary position of the rotary member. A digital voltmeter calibrated in angles of member rotation is coupled through a plurality of momentary contact push-button switches for normally receiving the d.c. signal indicative of angular rotation, and for alternatively and selectively receiving a signal indicative of a selected one of the set points for facilitating set point adjustment.

6 Claims, 5 Drawing Figures

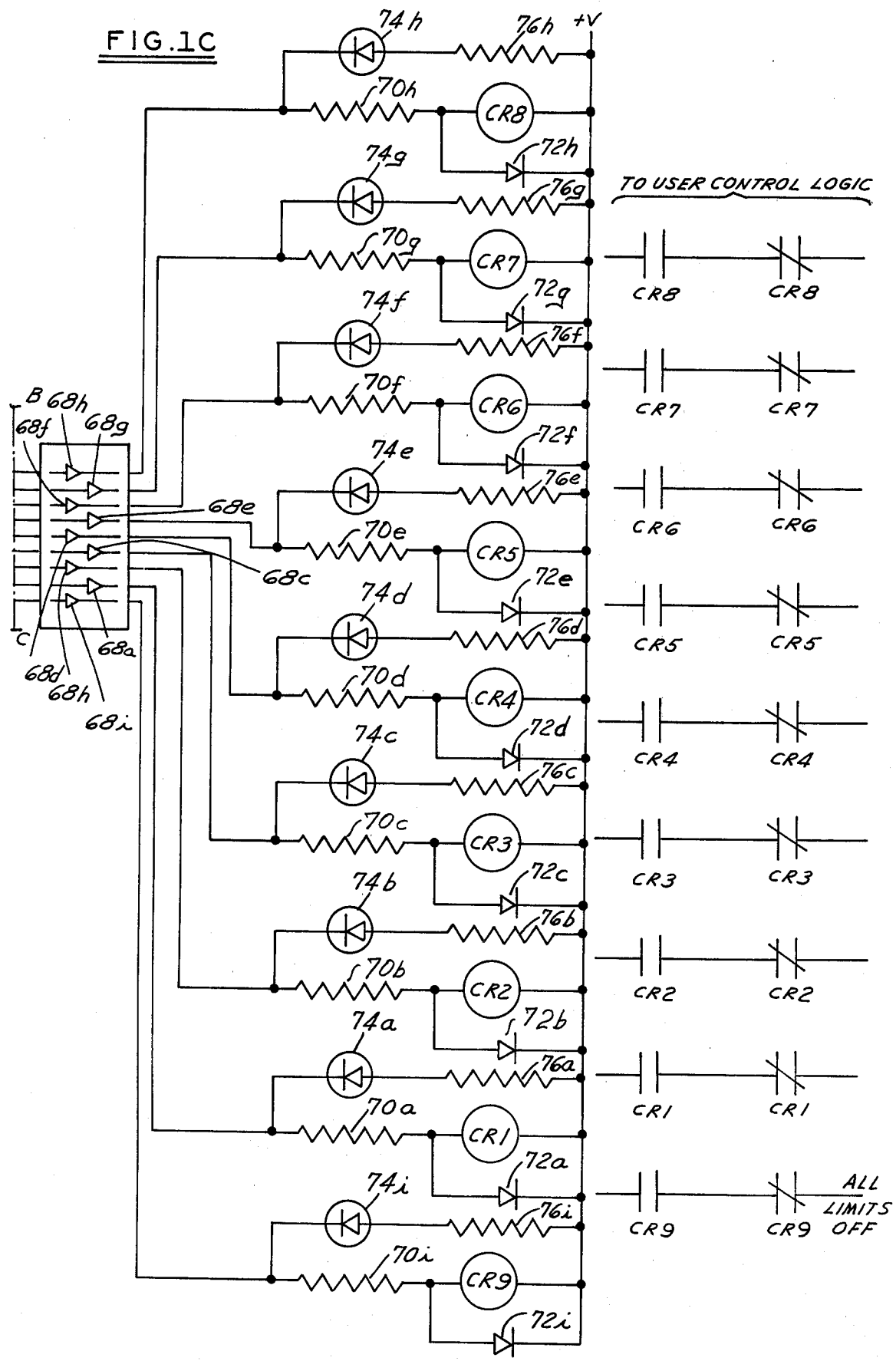

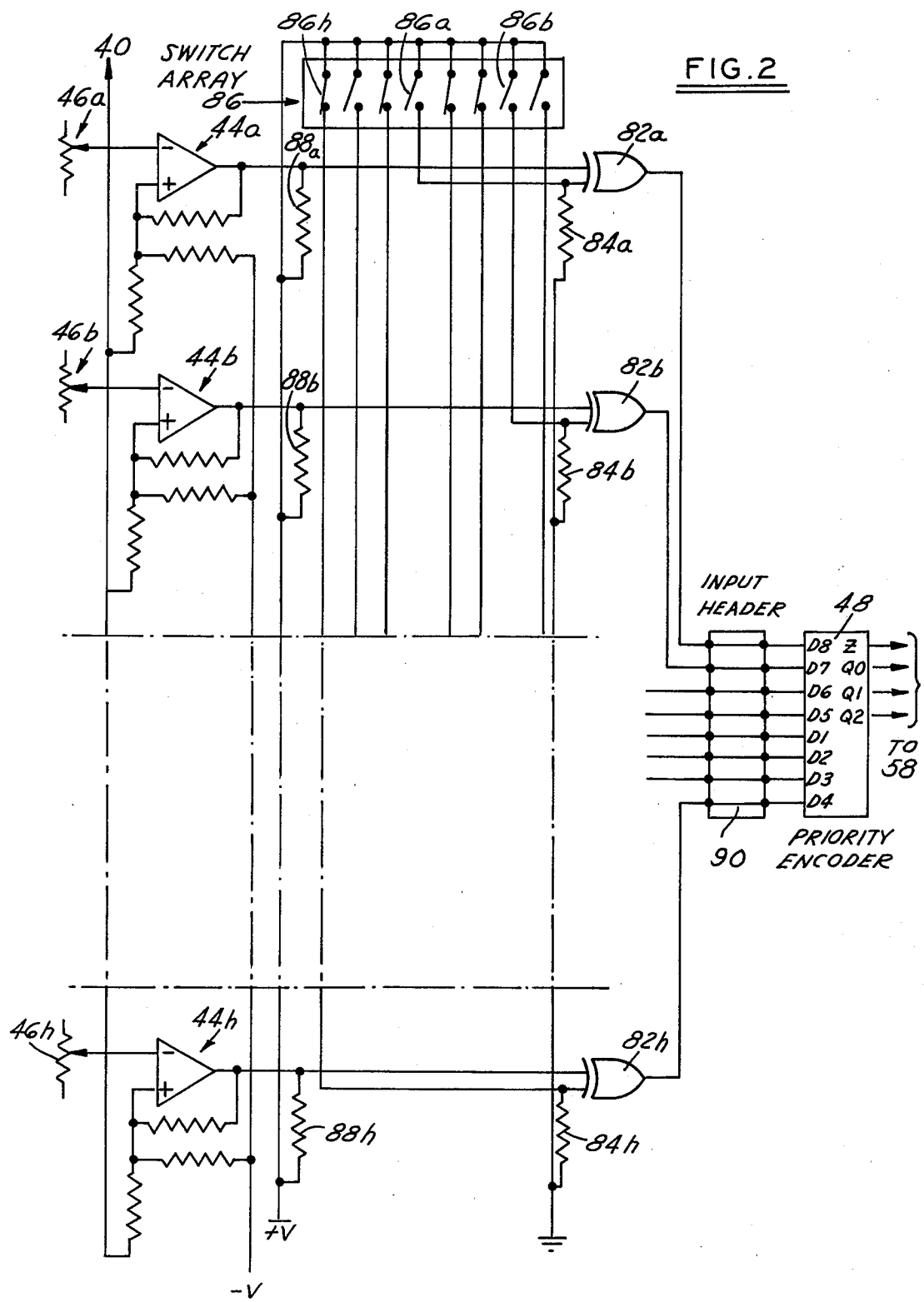

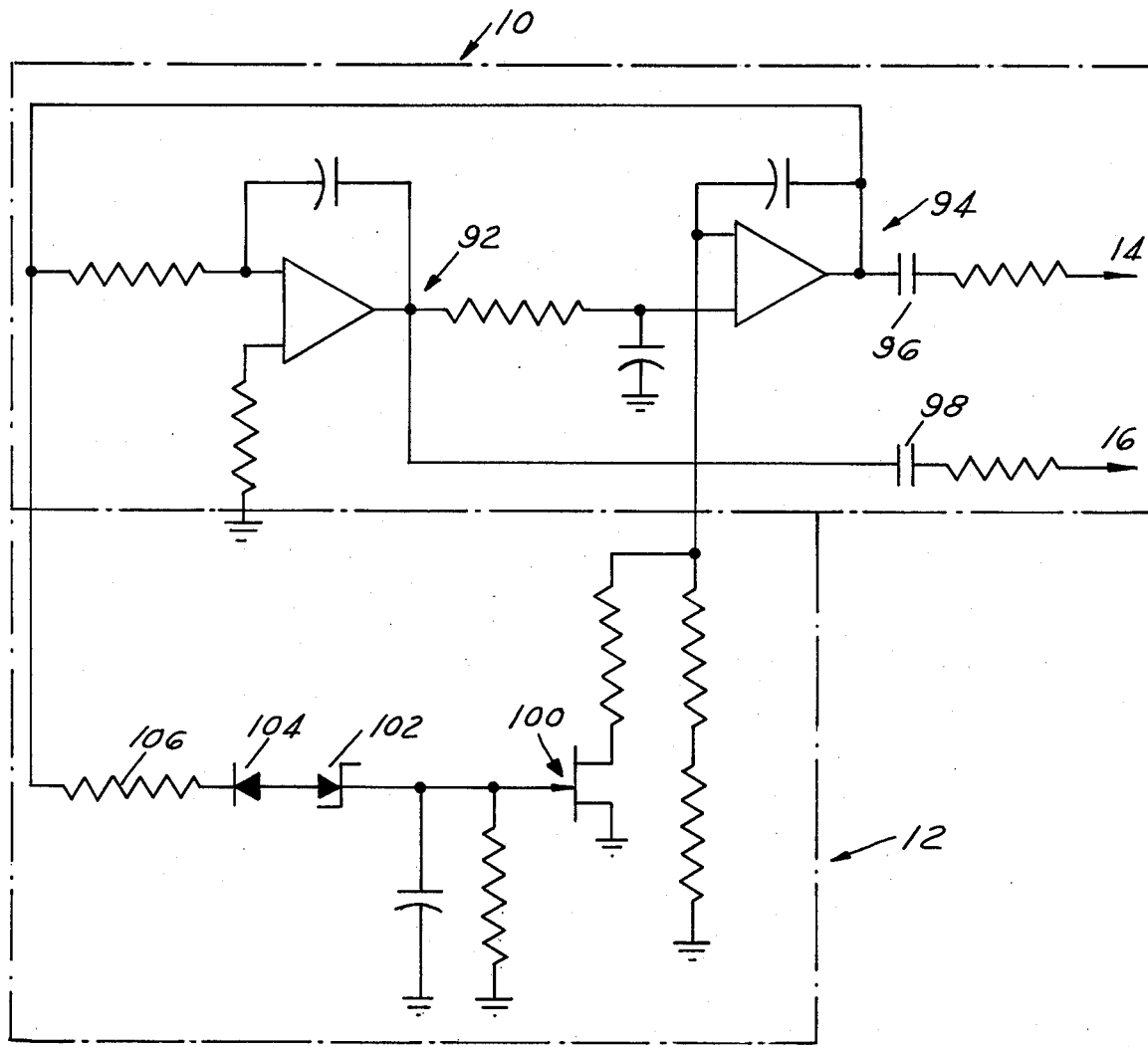

ROTARY POSITION INDICATING CIRCUIT

The present invention is directed to position indicating apparatus, and more particularly to an electrical circuit for indicating angular position of a rotary member.

In many industrial applications, including specifically the machine tool industry, it is desirable to provide an indication of angular position of a rotary member such as a tool shaft or lead screw. It is conventional in many such applications to provide limit switches responsive to switch or cam plates rotatably coupled to the rotary member for indicating passage of the shaft through corresponding angular positions. These limit switch arrangements are difficult to adjust and maintain to desired accuracy. Additionally, cyclic operation of the limit switches causes friction between the limit switch actuator and the surrounding switch seal which may eventually wear and thereby permit contamination of the switch contacts from coolant, dirt, etc. from the surrounding environment, with consequent switch and system failure. In large installations of this type, such as transfer lines having many limit switches, several hours are often required to locate and repair failure of a single limit switch.

Accordingly, a general object of the present invention is to provide an apparatus for indicating angular position of a rotary member with improved reliability and accuracy as compared with the prior art limit switch arrangements previously described. In particular, an object of the present invention is to provide a position indicating apparatus of the type described which eliminates entirely the requirement for limit switches and cam plates, etc. for directly indicating position of the rotary member.

Another object of the present invention is to provide an apparatus for indicating angular position of a rotary member in which position set points may be easily adjusted or readjusted by an operator.

The invention, together with additional objects, features and advantages thereof, will be best understood from the following description, the appended claims and the accompanying drawings in which:

FIG. 2 is a schematic diagram of a portion of FIG. 1 showing a modified embodiment of the invention; and FIG. 3 is a schematic drawing of another portion of the embodiment of FIG. 1.

Figure 1A:
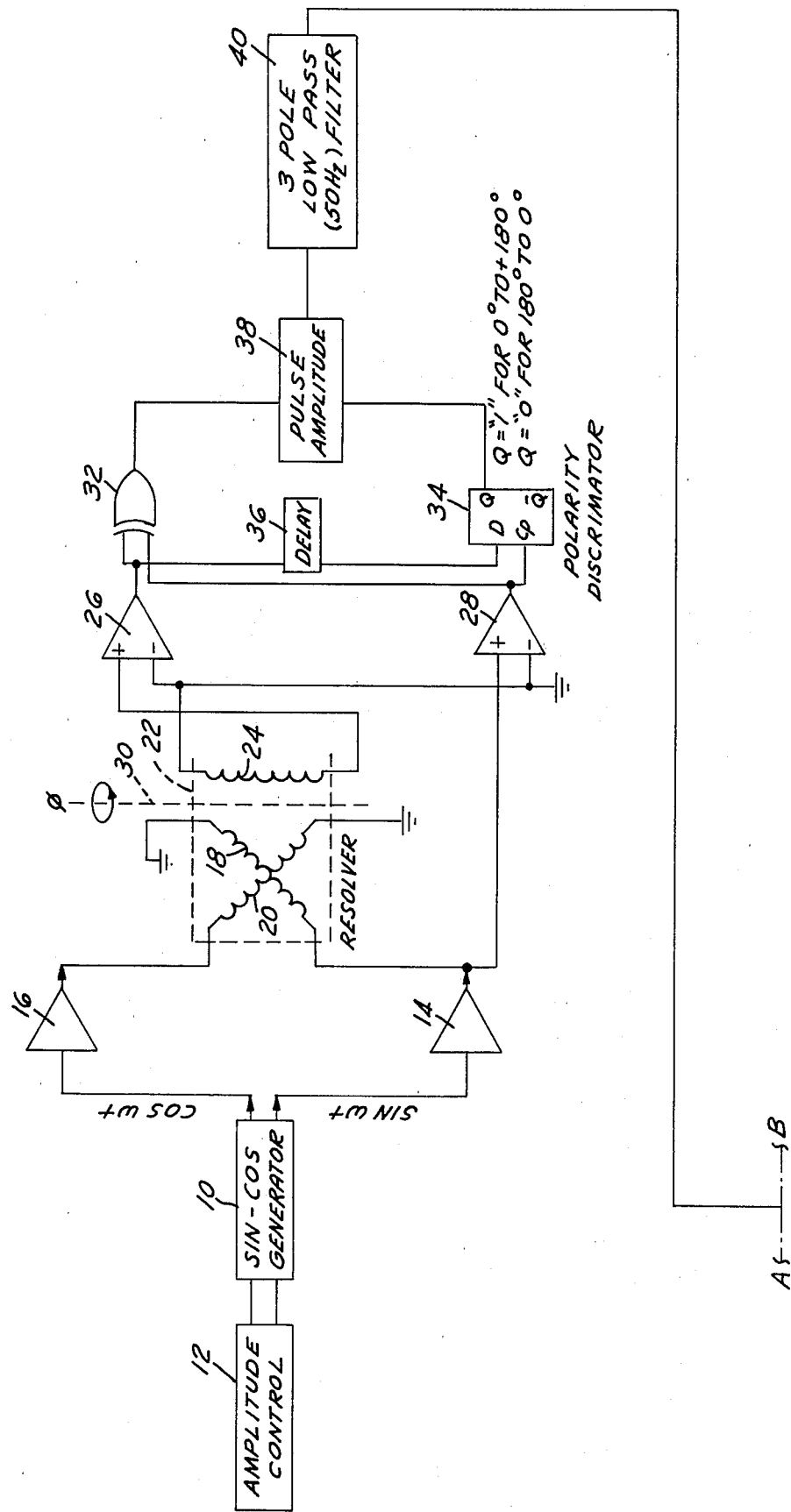
FIGS. 1 (A, B and C) is a partially schematic and partially functional block diagram of a presently preferred embodiment of a rotary position indicating circuit in accordance with the invention, FIGS. 1A and 1B being interconnected along the line A-B in each FIG., and FIGS. 1B and 1C being interconnected along the line B-C in each FIG.

Referring to FIGS. 1 (A, B and C), a presently preferred embodiment of the circuit in accordance with the invention illustrated therein comprises a sine-cosine generator 10 (FIG. 1A) coupled to an amplitude stabilization or control circuit 12 to comprise a quadrature sinusoid oscillator providing sine and cosine signals to the respective current amplifiers 14,16. Circuit details of generator 10 and control circuit 12 will be described in connection with FIG. 3. The outputs of sine current amplifier 14 and cosine current amplifier 16 are fed to the respective quadrature windings 18,20 of a conventional rotary transformer or resolver 22. The second terminal of each respective windings 18,20 is connected to ground. A third or signal output winding 24 of resolver 22 has one terminal connected to ground and a second terminal connected to the non-inverting input of a differential amplifier comparator 26. A reference signal taken from the output of sine current amplifier 14 is fed to the non-inverting input of a second differential amplifier comparator 28. The inverting inputs of comparators 26,28 are connected to ground. As will be recognized and appreciated by persons skilled in the art, the phase angle between the resolver output signal at the non-inverting input of comparator 26 and the reference signal to comparator 28 will vary as a linear function of angular position phi ($\phi$) of a rotary member indicated schematically at 30 coupled to resolver 22. It will also be appreciated that amplifier comparators 26,28 provide a high or logical one output when the signal voltage at the corresponding non-inverting input is greater than the ground reference level at the inverting input, and a low or logical zero output when the non-inverting input voltage is less than the grounded inverting input.

An exclusive-OR (EOR) gate 32 has a first input connected to the output of comparator 26 and a second input connected to the output of comparator 28. Thus, the output of EOR gate 32 comprises a periodic digital or "square wave" signal having a pulse width or duty cycle linearly proportional to the phase angle between the outputs of comparators 26,28, and thus proportional to angular position of member 30. A polarity discriminating D-type latch or flip-flop 34 has a D input connected through a delay circuit 36 to the output of amplifier 26 and a clock input connected to the output of amplifier 28. The state of the Q output of latch 34 thus indicates a leading or lagging relationship between the resolver output and reference signals. More particularly, a high or logical one output of latch 34 indicates that the output of comparator amplifier 26 leads the output of comparator amplifier 28, and is arbitrarily taken to indicate angular position between zero and one hundred eighty degrees in the positive angular direction. On the other hand, a low or logical zero Q output at latch 34 indicates that the reference signal leads the resolver output signal, and is arbitrarily taken to indicate an angular position between one hundred eighty degrees and zero degrees in the negative angular direction. In a preferred embodiment of the invention wherein sine-cosine generator 10 has an output frequency of 400 Hertz, delay 36 is operable for on the order of a few hundred nanoseconds.

The pulsed output of EOR gate 32 and the digital (high or low) output of latch 34 are fed to a pulse amplitude control circuit 38. The output of circuit 38 comprises a continuous square wave signal having a pulse width or duty cycle which varies as a function of the output of gate 32, i.e. as a linear function of angular position, and a polarity (positive or negative ) controlled by polarity latch 34. This output is fed to an integrator comprising a three-pole lowpass (fifty Hertz) Butterworth filter 40. The output of filter 40 thus comprises a d.c. analog voltage signal which varies linearly with shaft angle between a negative limit indicative of 180° of angular rotation in the negative angular direction, through zero volts indicative of a nominal zero position of the rotary member, to a positive limit indicative of rotation to 180° in the positive angular direction. The nominal zero position indicates, of course, the position of rotary member 30 at which the output of comparator 26 is exactly in phase with the output of reference comparator 28.

The output of filter 40 is connected to a set point controller 42 (FIG. 1B) which comprises a plurality of differential amplifiers for comparing the output of filter 40 with a corresponding plurality of d.c. reference signals indicative of desired angular set points. In the preferred embodiment of the invention illustrated in FIG. 1B, controller 42 comprises eight differential amplifier comparators 44a through 44h, such as Schmitt triggers or the like. The output of filter 40 is connected to the non-inverting input of each comparator 44a through 44h. The inverting inputs of comparators 44a through 44h are each connected to the wiper of a corresponding adjustable resistor 46a through 46h. Adjustable resistors 46a through 46d are connected between a positive voltage +V and ground, while adjustable resistors 46e through 46h are connected between a negative voltage −V and ground.

The outputs of comparator amplifiers 44a through 44d are connected to respective data inputs D8,D7,D6 and D5 of an eight bit priority encoder 48. The outputs of comparator amplifiers 44e through 44h are connected through the corresponding inverters 50 through 56 to respective data inputs D1,D2,D3 and D4 of priority encoder 48. The Q0,Q1 and Q2 outputs of encoder 48 comprise a binary coded signal indicating the highest priority input signal, with the priority ascending from the lowest priority at input D1 to the highest priority at input D8. Additionally, encoder 48 provides a Z output signal when all encoder inputs are zero. In a working embodiment of the invention, encoder 48 comprises a Motorola MC14532B encoder.

It will be appreciated that priority encoder 48, coupled with inverters 50-56, effectively program or set a zero (Z) output from encoder 48 to correspond to a nominal "zero" position of the monitored rotary member. In this embodiment, the "zero" position or range of positions is that wherein the d.c. output of filter 40 is less than each of the positive reference set points at 46a-46d but greater than each of the negative set points at 46e-46h. At this "zero" position, the non-inverting signal inputs to comparators 44a through 44d will be less than the corresponding reference inputs and the amplifier outputs to encoder 48 will be zero. Conversely, the signal inputs to comparators 44e through 44h will be greater than the corresponding reference inputs since the reference resistors 46e-46h are connected to a negative voltage, such that the outputs of amplifiers 44e through 44h will be high. Such outputs are inverted by amplifiers 50-56 so that the corresponding inputs at D1-D4 to encoder 48 are also zero. All inputs D1-D8 being a logical zero, encoder zero output Z will be high.

As the rotary member moves in the positive angular direction such that the output voltage of filter 40 increases positively, such voltage will successively pass the voltage set points of resistors 46d through 46a (assuming set points at progressively increasing voltage levels) to provide corresponding high or logical one inputs to encoder inputs D5 through D8. On the other hand, as the rotary member moves in the negative angular direction such that the output of filter 40 decreases (i.e. increases in the negative direction), comparators 44e through 44h will be successively turned off so as to provide high or logical one inputs to encoder inputs D1 through D4. With the encoder inputs D1-D8 connected as described, and assuming increasing voltage set points from 46d to 46a and decreasing voltage set points from 46e to 46h, increasing order of priority will automatically be given to negative angular positions from zero to 180° and then to positive angular positions from zero to +180°.

It will be appreciated that the arbitrary zero (Z) output position of encoder 48 could be programmed to coincide with shaft position between the set points of resistors 46e and 46f, for example, by eliminating inverter 50. For obtaining the preferred mode of operation hereinabove described wherein priority is progressively accorded positions from "zero" in the negative direction and then from zero in the positive direction, the inputs D1-D4 should be reconnected for such a modification such that inverters 52,54,56 are connected to inputs D1,D2,D3 and comparator 44e is connected to input D4. It will also be appreciated that, for programming the arbitrary zero position of encoder 48 between set point resistors 46d and 46e are hereinabove described, inverters 50 through 56 may be eliminated by reversing the inverting and non-inverting inputs to comparators 44e through 44h.

The binary coded outputs Q0-Q2 and zero output Z of encoder 48 are respectively connected to the data inputs D1-D4 of a four-bit latch or register 58 which receives a clock input from a continuously running oscillator 60. In a working embodiment of the invention, oscillator 60 has a frequency of 50 kilohertz and register 58 comprises a Motorola MC14076B four bit D-type register. Register 58 also receives a "save" signal from an operator push-button 62 through a buffer 64 for holding or saving the output of encoder 48 independently of clock oscillator 60. The outputs Q0-Q3 of register 58, which provide a binary coded indication of stored priority encoder output, are fed to the D1-D4 inputs of a binary-to-decimal decoder 66 which has a plurality of outputs Q1-Q8 for individually indicating passage of the rotary member past the set points of resistors 46a-46h in the programmed order of priority. Decoder 66 also has an output Q9 for indicating the above-described arbitrary zero encoder output position. In a working embodiment of the invention, decoder 66 comprises a Motorola MC14028B BCD to decimal decoder.

Decoder outputs Q1 through Q9 are fed to corresponding relay drivers 68a-68i (FIG. 1C). Each relay driver is connected through a current limiting resistor 70a-70i to the actuator of a corresponding relay CR1 to CR9, which may comprise electromagnetic relays as shown in the drawings or suitable solid-state relays. A diode 72a-72i is connected across the winding of each relay coil CR1 through CR9 in the reverse polarity direction to suppress ringing. An LED 74a-74i is connected in series with a current limiting resistor 76a-76i in the forward current direction across each relay CR1-CR9 and corresponding resistors 70a-70i for indicating on a control panel or the like the actuated set point of highest priority. Relays CR1-CR9 also include suitable normally open and/or normally closed contact sets associated therewith for use in machine control logic or the like.

In accordance with another important feature of the invention, set point controller 42 (FIG. 1B) includes means for facilitating adjustment or readjustment of the programmed set points corresponding to resistors 46a-46h. Such means comprise a plurality of eight momentary contact push-button switches 80a-80h, each having a normally open contact connected to the wiper of the corresponding set point adjustable resistor 46a–46h. The common contacts of first push-button switch 80a are connected to the normally closed contact of switch 80b, and the common contacts of each succeeding switch 80b–80g are connected to the normally closed contact of the next-succeeding switch 80c–80h. The normally closed contact of the first switch 80a is connected to receive to the output of filter 40, and the common contacts of the last switch 80h are connected through the series resistors 82,84 to ground. A digital voltmeter 86, preferably calibrated to read angular position in degrees between −180° to +180°, is connected to the junction of resistors 82,84. Thus, with all push-button switches 80a–80h in the normally closed position shown in the drawings, voltmeter 86 reads the angular position of the rotary member as indicated at the output of filter 40. However, closure of any switch 80a–80h by an operator will couple the wiper of the corresponding set point resistor 46a–46h to the input of voltmeter 86 through the normally closed and common contacts of the succeeding switches. The operator will thus be able to read at voltmeter 86 calibrated in angular degrees the set point of the resistor corresponding to the actuated switch.

FIG. 2 illustrates the schematic details of comparator amplifiers 44a,44b and 44h (amplifiers 44c–44g being identical thereto), and also illustrates a modification to the basic embodiment of FIG. 1 for adjustably programming the arbitrary zero output set point of priority encoder 48. In accordance with such embodiment, a plurality of EOR gates 82a–82h each have a first input connected to the output of the corresponding comparator 44a–44h and a second input connected through a corresponding resistor 84a–84h to ground. The second input of each EOR gate 82a–82h is also connected through a corresponding switch of a programmable switch array 86 to a positive voltage +V. The output of each comparator amplifier 44a–44h is also connected to voltage +V through a corresponding resistor 88a–88h. The outputs of EOR gates 82a–82h are connected through a programming header generally indicated at 90 to the priority coding inputs D1–D8 of encoder 48.

Figure 1B:
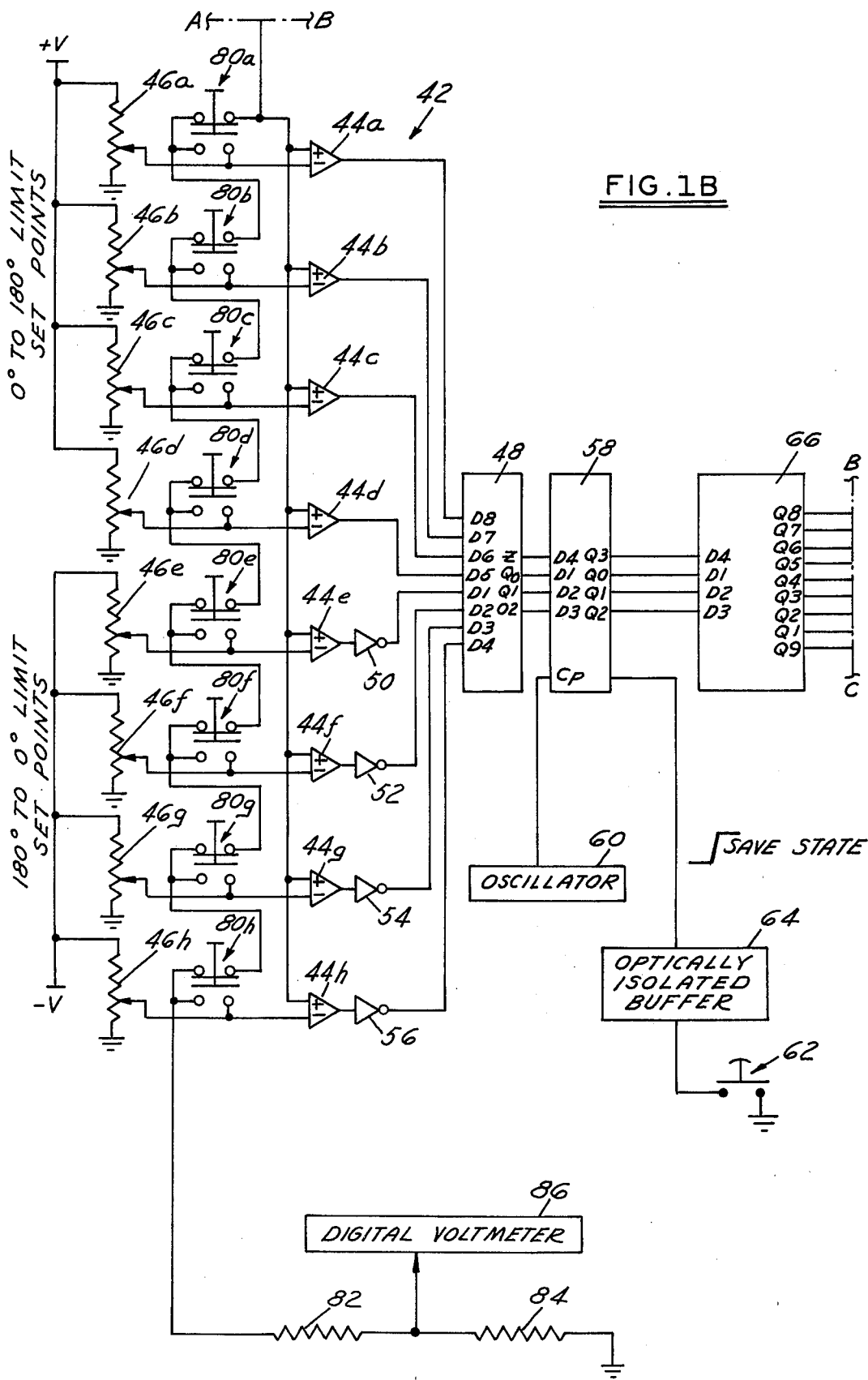

In operation of the modification of FIG. 2, closure of the switches in array 86 corresponding to comparator amplifiers 44e–44h (only switch 86h corresponding to comparator 44h being specifically identified), and opening of the switches in array 86 corresponding to comparators 44a–44d (only switches 86a and 86b being identified) will cause the modified embodiment of FIG. 2 to operate exactly as previously described in connection with FIG. 1B. More particularly, with the switch 86a in array 86 connected to the second input of EOR gate 82a open as shown, the second gate input is drawn to a low or logical zero through resistor 84a so that the output of EOR gate 82a effectively follows the first input thereto from comparator amplifier 44a. Switch 86b and EOR gate 82b cooperate similarly, as do EOR gates 82c and 82d (not shown) and the corresponding array switches. On the other hand, with the switch 86h in array 86 coupled to the second input of EOR gate 82h closed, the second gate input is drawn to a high or logical one state by connection through the array switch to voltage +V. The EOR gate output is thereby the inverse of the first gate input from the corresponding comparator amplifier 44h. Gates 82e–82g (not shown) and the corresponding switches in array 86 cooperate similarly. Switch array 86 cooperates with EOR gates 82a–82h programmably to add or delete "inverting elements" which individually operate in a manner analogous to that previously described in connection with inverters 50–56 in the basic embodiment of FIG. 1B. It will therefore be understood that the zero output condition of encoder 48 may be readily programmed or reprogrammed by selected actuation of the switches in array 86.

Input header 90, which comprises a plurality of jumpers, may also be used for programming the output of priority encoder 48, either alone or in cooperation with switch array 86. As shown in FIG. 2, the jumpers of input header 90 effectively connect comparator amplifiers 44a–44h to the priority encoder inputs D1–D8 as previously described in connection with FIG. 1. Such connection may be readily varied by merely reorienting the jumpers on header 90.

FIG. 3 illustrates sine-cosine generator 10 and amplitude control circuit 12 in schematic detail. Generator 10 comprises a quadrature oscillator having an inverting differential amplifier integrator 92 and a non-inverting differential amplifier integrator 94 respectively providing sinusoidal sine and cosine signals separated in phase by exactly 90°. The integrator outputs are connected to current amplifiers 14,16 (FIG. 1A) through the coupling capacitors 96,98. The double integrator sine-cosine generator to the extent thus far described is generally conventional. In accordance with an important feature of the present invention, the amplitude of the sine and cosine outputs of generator 10 are closely controlled and stabilized by the control circuit 12. Circuit 12 comprises an FET 100 which has a source connected to ground, a drain connected to the inverting input of amplifier integrator 94 and a gate connected through the cathode-anode of a zener diode 102, the silicon diode 104 and the resistor 106 to the output of amplifier integrator 94. FET 100 operates as a variable resistance to control the gain of amplifier integrator 94 as a function of the amplitude of the control signal at the FET gate through diodes 102,104 and resistor 106.

The invention claimed is:

1. Apparatus for indicating angular position of a rotary member over a selected angular range comprising means adapted to be coupled to a said rotary member for providing a d.c. first output signal at a level which varies as a function of angular position of said rotary member over said angular range,
a plurality of threshold means responsive to said first output signal for indicating passage of said first output signal through a plurality of thresholds corresponding to preselected angular positions of said angular member within said range, each of said plurality of threshold means providing a d.c. second output signal indicative of passage of said first output signal through a corresponding said threshold,
priority means for assigning a selected order of priority among said second output signals corresponding to a selected order of preselected angular positions within said range from a nominal zero position, and
means operatively coupled to said threshold means and to said priority means and responsive to said second output signals for indicating a one of said output signals of highest priority corresponding to a one of said preselected angular positions farthest from said nominal zero reached by said rotary member.

2. The apparatus set forth in claim 1 further comprising means for selecting a said nominal zero position within said range such that said first output signal traverses a range which includes d.c. voltage levels greater than and less than a level corresponding to said nominal zero position, and wherein said priority indicating means includes a plurality of threshold direction means comprising first means operatively coupled to first ones of said threshold means corresponding to angular positions in one direction from said nominal zero position for indicating when said first output signal is greater than said corresponding thresholds of said first ones of said threshold means, and second means operatively coupled to second ones of said threshold means corresponding to angular positions in the other direction from said nominal zero position for indicating when said first output signal is less than said corresponding thresholds of said second ones of said threshold means.

3. The apparatus set forth in claim 2 further comprising means for varying said nominal zero position within said angular range by selectively programming individual ones of said threshold direction means so as to constitute one of said first and second means.

4. The apparatus set forth in claim 3 wherein said threshold means comprises a plurality of comparators each having one input for receiving said first output signal, a second input receiving a reference voltage and an output for providing a digital signal as a function of whether said first output signal is greater or less than said threshold, wherein said threshold direction means comprises a plurality of exclusive-OR gates each having one gate input connected to receive to a corresponding said digital output and a second gate input, and wherein said means for selectively programming said threshold direction means comprises programming switch means for selectively applying a logic one or a logic zero to each said second gate input such that the output of each said exclusive-OR gate selectively inverts or tracks the output of the corresponding comparator.

5. The apparatus set forth in claim 1 wherein said threshold means comprises a plurality of variable resistance means for providing a corresponding plurality of selectable reference voltages and a plurality of comparators each connected to compare said first output signal to a corresponding one of said reference voltages, and wherein said apparatus further comprises a voltmeter and means for selectively connecting said first output signal and said plurality of selectable reference voltages to said voltmeter, said last-named means comprising a plurality of switches corresponding in number to said plurality of variable resistance means and each having a normally open contact, a normally closed contact and a common contact, the normally open contact of each said switch being connected to the corresponding said variable resistance means, the normally closed contact of a first of said switches being connected to receive said first output signal, the normally closed contact of each succeeding switch being connected to the common contact of the next preceding switch, and the common contact of the last said switch being connected to said voltmeter, such that said voltmeter is normally connected to receive said first output signal through the common and normally closed contacts of said plurality of switches, and is connected to receive a said reference voltage upon actuation of the corresponding said switch through the common and normally open contacts of the said corresponding said switch and the common and normally closed contacts of the succeeding said switches.

6. The apparatus set forth in claim 5 wherein said voltmeter comprises a digital voltmeter calibrated in degrees of angular rotation of said rotary member, such that said digital voltmeter is adapted to read said reference voltages as reference angles when the corresponding said switches are actuated and to read said first output signal in degrees of angular position of said rotary member when all of said switches are unactuated.

* * * * *